(12) United States Patent
Chung et al.

(10) Patent No.: US 8,908,778 B2
(45) Date of Patent: Dec. 9, 2014

(54) RAIL-TO-RAIL COMPARATOR, PULSE AMPLITUDE MODULATION RECEIVER, AND COMMUNICATION SYSTEM USING THE SAME

(75) Inventors: Jin Il Chung, Icheon-si (KR); Jun Hyun Chun, Icheon-si (KR); Jin Wook Burm, Seoul (KR); Dae Ho Yun, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 200 days.

(21) Appl. No.: 13/590,282

(22) Filed: Aug. 21, 2012

(65) Prior Publication Data

US 2013/0156126 A1 Jun. 20, 2013

(30) Foreign Application Priority Data

Dec. 19, 2011 (KR) ........................ 10-2011-0137481

(51) Int. Cl.
*H04B 14/06* (2006.01)
(52) U.S. Cl.
USPC ........... 375/244; 375/259; 375/320; 375/353; 332/115; 327/65; 327/74
(58) Field of Classification Search
USPC ......... 375/244, 257, 259, 268, 300, 320, 353, 375/377; 332/115, 116; 327/63, 65, 74, 77
See application file for complete search history.

(56) References Cited

U.S. PATENT DOCUMENTS

| | | | | |
|---|---|---|---|---|
| 3,735,392 | A * | 5/1973 | Kaneko | 341/127 |
| 6,970,022 | B1 | 11/2005 | Miller | |
| 2003/0011426 | A1* | 1/2003 | Casper | 330/9 |
| 2004/0141567 | A1* | 7/2004 | Yang et al. | 375/287 |
| 2008/0174343 | A1* | 7/2008 | Cha et al. | 327/64 |
| 2010/0309964 | A1* | 12/2010 | Oh et al. | 375/219 |

FOREIGN PATENT DOCUMENTS

JP 06085570 A 3/1994

OTHER PUBLICATIONS

Sunghyun Park, Yorgos Palaskas, Ashoke Ravi, Ralph E. Bishop, Michael P. Flynn, A 3.5 GS/s 5-b Flash ADC in 90 nm CMOS, IEEE 2006 Custom Intergrated Circuits Conference (CICC), p. 489-492, University of Michigan, Ann Arbor, Michigan (USA) and Intel Corporation, Hillsboro, Oregon (USA).

Lauri Sumanen et al., A Mismatch Insensitive CMOS Dynamic Comparator for Pipeline A/D Converters, p. 32-35, Helsinki University of Technology, Electronic Circuit Design Laboratory, Finland.

* cited by examiner

*Primary Examiner* — Dac Ha
(74) *Attorney, Agent, or Firm* — William Park & Associates Patent Ltd.

(57) ABSTRACT

A rail-to-rail comparator including a first comparison unit connected to a first terminal and configured to compare differential input signals to differential reference voltages; a second comparison unit connected to a second terminal and configured to compare the differential input signals to the differential reference voltages; and an output unit configured to be driven in response to a clock signal and to generate a complementary output signal according to comparison results of the first and second comparison units.

23 Claims, 5 Drawing Sheets

| Differential Reference Voltages | | Differential Input Signals | | Decision | |
|---|---|---|---|---|---|
| REF1 | REF2 | INP | INN | OUTP | OUTN |
| 1/6xVDD | 5/6xVDD | VDD | GND | VDD | GND |
| | | 2/3xVDD | 1/3xVDD | GND | VDD |
| | | 1/3xVDD | 2/3xVDD | GND | VDD |
| | | GND | VDD | GND | VDD |
| 1/2xVDD | 1/2xVDD | VDD | GND | VDD | GND |
| | | 2/3xVDD | 1/3xVDD | VDD | GND |
| | | 1/3xVDD | 2/3xVDD | GND | VDD |
| | | GND | VDD | GND | VDD |
| 5/6xVDD | 1/6xVDD | VDD | GND | VDD | GND |
| | | 2/3xVDD | 1/3xVDD | VDD | GND |
| | | 1/3xVDD | 2/3xVDD | VDD | GND |
| | | GND | VDD | GND | VDD |

RAIL-TO-RAIL COMPARATOR, PULSE AMPLITUDE MODULATION RECEIVER, AND COMMUNICATION SYSTEM USING THE SAME

CROSS-REFERENCES TO RELATED APPLICATION

The present application claims priority under 35 U.S.C. §119(a) to Korean application number 10-2011-0137481, filed on Dec. 19, 2011, in the Korean Intellectual Property Office, which is incorporated herein by reference in its entirety.

BACKGROUND

1. Technical Field

The present invention relates generally to a data transmitter/receiver, and more particularly, to a rail-to-rail is comparator and a pulse amplitude modulation (PAM) receiver using the same.

2. Related Art

A multi-level input/output system is a concept designed to transmit and receive a larger amounts of data without increasing a data transmission rate. In order to support the multi-level input/output system, various modulation methods such as pulse amplitude modulation (PAM), pulse duration modulation (PDM), and pulse position modulation (PPM) may be used.

Among the modulation methods, the PAM changes only the amplitude of a pulse without changing the width and period of the pulse. According to the number of symbols M to be transmitted, the PAM may be expressed as M-PAM (M is a natural number equal to or larger than two). That is, symbols transmitted and received in an M-PAM system have any one of M levels. The PAM is used in a system for converting an analog signal into a pulse-type digital signal. The system may include a communication system between integrated circuits (ICs), a power line communication system, a high-speed digital communication system, an ultra wideband communication system, and the like.

In a communication system using the M-PAM, a receiver requires reference signals having a constant voltage level to determine the voltage levels of symbols. Desirably, the receiver may determine the levels of received symbols using (M−1) reference signals. In order for the receiver to accurately determine the levels is of received symbols, a voltage margin between M symbols may be set to a large value.

However, with an increase of M, the voltage margin between symbols inevitably decreases. Furthermore, when the system is designed for low power consumption, a high-performance device is required to restore the received symbols.

In general, the receiver of the M-PAM system may include a comparison circuit, a decoder, and an output buffer. The comparison circuit is configured to compare an input signal to a reference voltage, amplify the compared signal, and output the amplified signal as a thermometer code. The decoder is configured to convert an output signal of a differential amplifier into corresponding data. The output buffer is configured to amplify the binary signal outputted from the decoder and output the amplified signal.

When the comparison circuit is to compare the input signal to the reference signal it must be able to accurately determine the level of the input signal. A current mode logic (CML) comparator and a CMOS dynamic comparator are widely known as circuits used for the comparison circuit.

FIG. 1 illustrates an example of a conventional CML comparator.

Referring to FIG. 1, a load is formed by serial connection between an inductor and a resistor. In FIG. 1, VINP and VINM represent analog differential inputs, VRP and VRM represent differential reference voltages, and VOUTP and VOUTM represent is output voltages of the comparator. When complementary clock signals VCLKP and VCLKM are at low and high levels, respectively, cross-coupled switching elements M7 and M8 are turned off, switching elements M3 and M6 are enabled, and the comparator operates as a pre-amplifier. On the other hand, when the complementary clock signals VCLKP and VCLKM transit to high and low levels, respectively, the switching elements M7 and M8 are enabled, and the comparator operates a regenerative latch.

Cascode elements M1 and M2 serve to reduce parasitic capacitance at an output node and improve a regenerative time constant. Furthermore, the cascode elements M1 and M2 prevent noise from being introduced into the reference voltages VRP and VRM. The gate terminals of the cascode elements M1 and M2 are controlled by the clock signal VCLKM, and switching elements M9 and M10 are controlled by the same clock signal VCLKM. Since the source potential of the cascode elements M1 and M2 is higher than the source potential of the switching elements M9 and M10, the cascode elements M1 and M2 are turned on later than the switching elements M9 and M10. Therefore, residual charges from the switching elements M7 and M8 are discharged through the output node, and disturbance between the reference voltages does not occur.

In the CML comparator illustrated in FIG. 1, all amplifiers used therein operate in an active region. Furthermore, when comparing an input voltage to the reference voltage, the CML comparator consumes a current as a tail current at all time. Therefore, the power consumption thereof inevitably increases. Furthermore, since there is a limitation on the range of the input voltage and the reference voltage, it is difficult to acquire high voltage resolution in a low power supply voltage environment. FIG. 1 also illustrates switching elements M4, M5, M11, and M12, power supply voltage VDD, and VSS.

FIG. 2 illustrates an example of a CMOS dynamic comparator. FIG. 2 also illustrates switching elements M25 to M32, power supply voltage VDD, and VSS.

The comparator illustrated in FIG. 2 performs a reset/regenerative operation according to the level of a clock signal CLK, compares input signals INP and INN to reference voltages REFP and REFN, respectively, and generates output voltages OUTP and OUTN at a high or low level.

The CMOS dynamic comparator has an advantage in that it has smaller power consumption than the CML comparator. However, when the levels of the input voltages INP and INN and the reference voltages REFP and REFN are lower than the threshold voltages of amplifiers, that is, switching elements M21 to M24, the amplifiers may be turned off. In this case, the CMOS dynamic comparator cannot operate.

That is, since the input voltage range is limited, it is difficult to guarantee a normal operation in a low power supply voltage environment.

SUMMARY

In an embodiment, a rail-to-rail comparator includes a first comparison unit connected to a first terminal and configured to compare differential input signals to differential reference voltages; a second comparison unit connected to a second terminal and configured to compare the differential input signals to the differential reference voltages; and an output unit configured to be driven in response to a clock signal and to generate a complementary output signal according to comparison results of the first and second comparison units.

In another embodiment, a rail-to-rail comparator includes: a first comparison unit configured to compare differential input signals to differential reference voltages; a second comparison unit configured to compare the differential input signals to the differential reference voltages; and an output unit configured to be driven in response to a clock signal, the output unit connected logically between the first and second comparison units, and configured to generate a complementary output signal.

In another embodiment, a rail-to-rail comparator includes: a first comparison unit configured to compare first and second input signals having a differential relationship to first and second reference voltages having a differential relationship, respectively; a second comparison unit configured to compare the first and second input signals to the first and second reference voltages, respectively; and an output unit configured to be connected logically between the first and second comparison units, and configured to generate an output signal according to an amount of current flowing through the first and second comparison units, in response to a clock signal.

In another embodiment, a PAM receiver includes: a comparison circuit configured to generate and compare differential input signals to differential reference voltages and generate an output signal; a decoder configured to restore a signal outputted from the comparison circuit into a data signal; and an output circuit configured to amplify and output the data signal outputted from the decoder, wherein the comparison circuit comprises: a first comparison unit configured to compare the differential input signals to the differential reference voltages; a second comparison unit configured to compare the differential input signals to the differential reference voltages; and an output unit configured to be driven in response to a clock signal, and the output unit configured to generate a complementary output signal according to a comparison result of the first and second comparison units.

In another embodiment, a PAM communication system includes: a transmitter configured to generate and output signals having any one level of a level to multiple levels, as a differential signal pair; and a receiver comprising a comparison circuit configured to receive the differential signal pair, compare the received differential signal pair to differential reference voltages, and generate an output signal, wherein the comparison circuit comprises: a first comparison unit configured to compare the differential signal pair to is the differential reference voltages; a second comparison unit configured to compare the differential signal pair to the differential reference voltages; and an output unit configured to be driven in response to a clock signal, and configured to generate a complementary output signal according to comparison results of the first and second comparison units.

BRIEF DESCRIPTION OF THE DRAWINGS

Features, aspects, and embodiments are described in conjunction with the attached drawings, in which.

DETAILED DESCRIPTION

Hereinafter, a rail-to-rail comparator and a PAM receiver using the same, will be described below with reference to the accompanying drawings through various embodiments.

Figure 3:
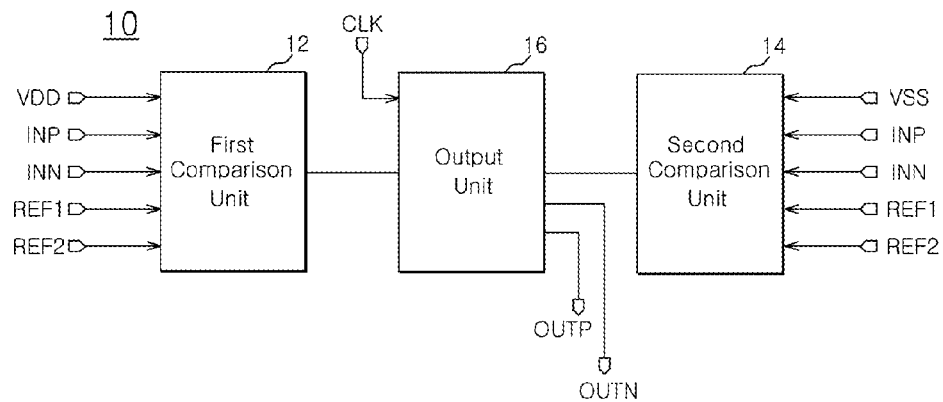
FIG. 3 is a configuration diagram of an example of a rail-to-rail comparator according to an embodiment.

FIG. 3 is a configuration diagram of an example of a rail-to-rail comparator according to an embodiment.

Referring to FIG. 3, the rail-to-rail comparator 10 according to an embodiment may include a first comparison unit 12, a second comparison unit 14, and an output unit 16. Logically, the output unit 16 may be connected between the first and second comparison units 12 and 14, respectively, as illustrated in FIG. 3.

The first comparison unit 12 may be connected to a power supply voltage terminal VDD, and configured to provide a comparison result between differential input signals INP and INN, and differential reference voltages REF1 and REF2 to the output unit 16.

Similarly, the second comparison unit 14 may be connected is to a power supply voltage terminal VDD, and configured to provide a comparison result between the differential input signals INP and INN and the differential reference voltages REF1 and REF2 to the output unit 16.

The output unit 16 may be driven in response to a clock signal CLK, and configured to output complementary output signals OUTP and OUTN as digital signals at a high or low logic voltage level according to the comparison results provided from the first and second comparison units 12 and 14.

In this embodiment, the first comparison unit 12 may compare the differential input signals INP and INN having a first voltage range to the differential reference voltages REF1 and REF2, and the second comparison unit 14 may compare the differential input signals INP and INN having a second voltage range to the differential reference voltages REF1 and REF2.

Here, the first voltage range may be set to $0\sim(1/2)$VDD, and the second voltage range may be set to $(1/2)$VDD$\sim$VDD. Therefore, even when the levels of the differential input signals INP and INN and/or the differential reference voltage REF1 and REF2 are lower than the threshold voltages of the amplifies forming the comparison units 12 and 14, the first comparison unit 12 may operate to accurately determine the input signal level.

For this operation, the first comparison unit 12 may be configured as a first-type differential amplifier, for example, a PMOS differential amplifier, and the second comparison unit 14 may be is configured as a second-type differential amplifier, for example, an NMOS differential amplifier.

The differential input signals INP and INN and the differential reference voltages REF1 and REF2 may be provided to the first and second comparison units 12 and 14, respectively, at the same time or substantially the same time. According to the levels of the differential input signals INP and INN and the differential reference voltages REF1 and REF2, the first and second comparison units 12 and 14, respectively, may operate to perform the comparison and amplification operation. That is, although the differential input signals INP and INN and the differential reference voltages REF1 and REF2 are provided to the first and second comparison units 12 and 14 at the same time or substantially the same time, any one of the comparison units may maintain a turn-off state according to the levels of the differential input signals INP and INN and the differential reference voltages REF1 and REF2. As a result, only one comparison unit may operate.

Furthermore, the comparison and amplification result of the first or second comparison unit 12 or 14, respectively, may be latched by the output unit 16, and then provided as the output signals OUTP and OUTN in response to the clock signal CLK.

Figure 4:
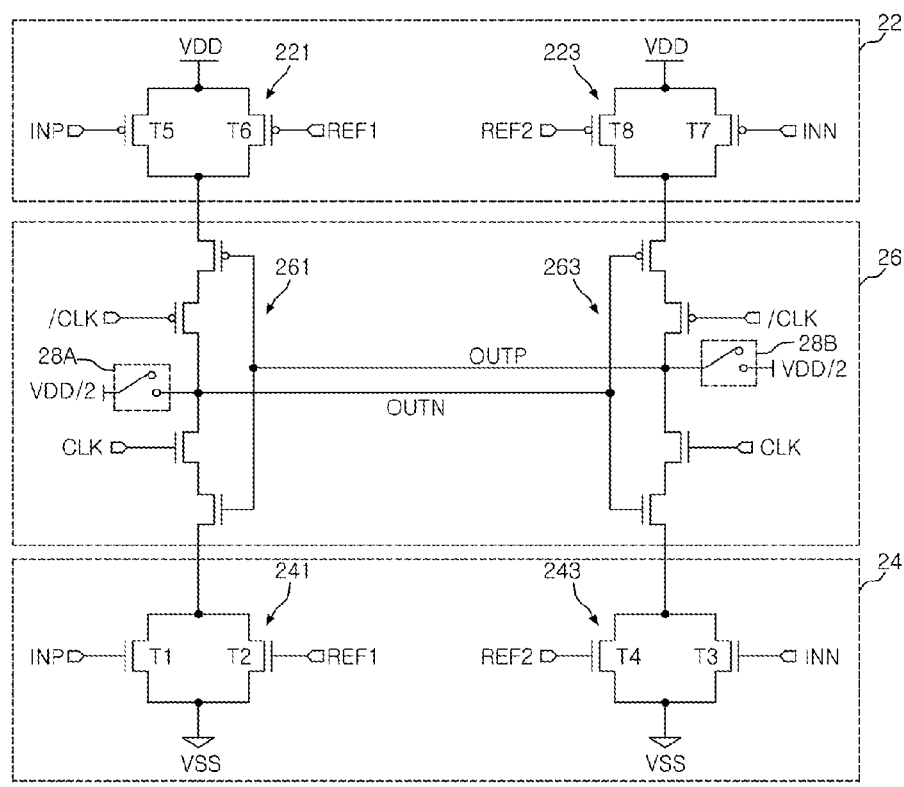
FIG. 4 is a circuit diagram of the rail-to-rail comparator illustrated in FIG. 3.

FIG. 4 is a circuit diagram of the rail-to-rail comparator illustrated in FIG. 3. Logically, the output unit 26 may be connected between the first and second comparison units 22 and 24, respectively, as illustrated in FIG. 4.

Referring to FIG. 4, the first comparison unit 22 may include a first comparator 221 configured to compare a first input signal INP to a first reference voltage REF1, and a second comparator 223 configured to compare a second input signal INN to a second reference voltage REF2. The first and second comparators 221 and 223 may be configured as PMOS amplifiers. Accordingly, even when the input signals INP and INN having the first voltage range of 0 to (1/2)VDD and the reference voltages REF1 and REF2 are applied, the first and second comparators 221 and 223 may operate to control the amount of current flowing into the output unit 26.

The second comparison unit 24 may include a third comparator 241 configured to compare the first input signal INP to the first reference voltage REF1 and a fourth comparator 243 configured to compare the second input signal INN to the second reference voltage REF2, in order to control the amount of current flowing into the output unit 26.

The output unit 26 may include first and second latches 261 and 263, respectively. The first latch 261 may be connected between the first comparator 221 and the third comparator 241 and configured to output a first output signal OUTP. The second latch 263 may be connected between the second comparator 223 and the fourth comparator 243 and configured to output a second output signal OUTN. Furthermore, the first and second latches 261 and 263, respectively, may perform a reset/regenerative operation according to the phase of the clock signal CLK.

The first latch 261 may be driven by the clock signal CLK and the inverted clock signal /CLK, and may generate the first output signal OUTP according to the amount of current induced in a first output node OUTP. The second latch 263 may be driven by the clock signal CLK and the inverted signal /CLK, and may generate the second output signal OUTN according to the amount of current induced in a second output node OUTN. The first and second output signals OUTP and OUTN may be outputted as complementary signals at a high or low logic voltage level.

Meanwhile, the rail-to-rail comparator 20 according to an embodiment may further include precharge units 28A and 28B. The precharge units 28A and 28B may reset the output signals OUTP and OUTN to a designated voltage level, desirably, (1/2)VDD, when the clock signal CLK has a reset phase.

As such, the rail-to-rail comparator 20 according to an embodiment may be characterized in that, even when the levels of the input signals INP and INN and the reference signals REF1 and REF2 may be lower than the threshold voltages of the amplifiers, the first comparison unit 22 may operate to perform a comparison and amplification operation. Therefore, the rail-to-rail comparator 20 may compare input signals in all voltage ranges to the reference voltages, and output the results as digital values.

Furthermore, since the first and second comparison units 22 and 24, respectively, may be configured in a complementary manner, the first and second comparison units 22 and 24, respectively, may is perform comparison operations according to the voltage levels of the input signals. Therefore, the comparison operations may be performed in a relatively wide input range. Furthermore, the comparison operation between the input signals and the reference voltages may be performed based on CMOS logic that has no current consumption. Therefore, it is possible to secure a low power characteristic.

The rail-to-rail receiver may be applied to a PAM receiver, and the configuration will be described as follows.

Figure 5:
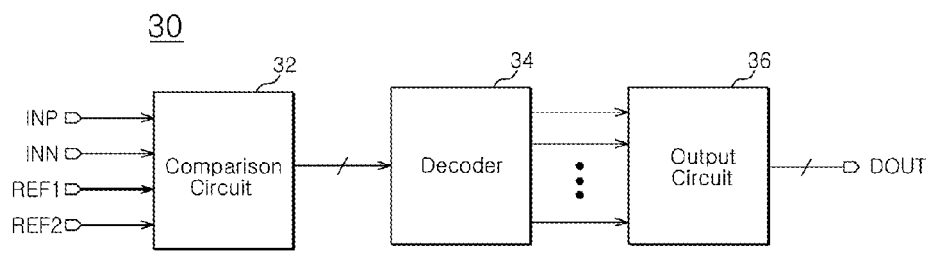
FIG. 5 is a configuration diagram of an example of a PAM receiver according to another embodiment.

FIG. 5 is a configuration diagram of an example of a PAM receiver according to an embodiment.

Referring to FIG. 5, the PAM receiver 30 may include a comparison circuit 32, a decoder 34, and an output circuit 36.

The comparison circuit 32 may be configured to compare differential input signals INP and INN to differential reference voltages REF1 and REF2, and output the comparison result as a thermometer code. According to a modulation level M of a system to which the PAM receiver 30 may be applied, the PAM receiver 30 may be configured as an M-PAM receiver. In this case, the comparison circuit 32 may include (M−1) comparators configured to compare the pair of differential input signals INP and INN to (M−1) differential reference voltages, respectively. Furthermore, each of the (M−1) comparators may include the rail-to-rail comparator 10 or 20 illustrated in FIG. 3 or 4.

The decoder 34 may be configured to restore the signal is outputted from the comparison circuit 32 into a data signal, and the output circuit 36 may be configured to amplify the binary signal outputted from the decoder 34 and output the amplified signal as a data signal DOUT.

Furthermore, the decoder 34 may include thermometer-to-binary logic that converts a thermometer code into binary data, but is not limited thereto.

Figure 6:
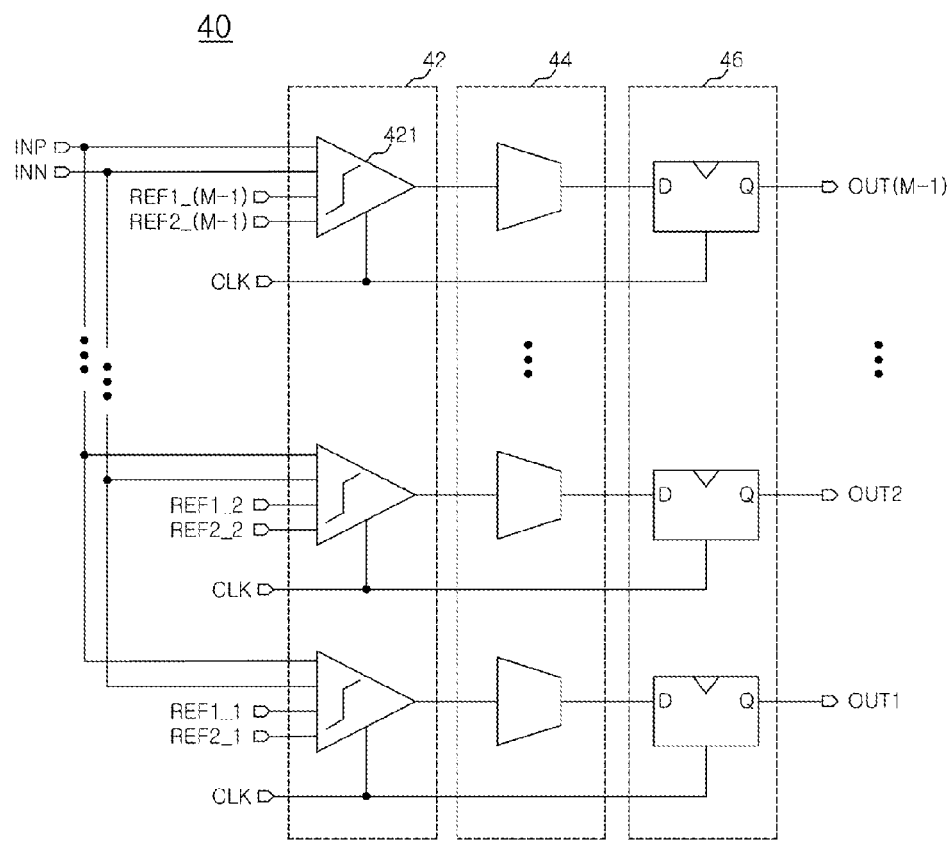
FIG. 6 is a circuit diagram of the comparison circuit illustrated in FIG. 5.

FIG. 6 is a circuit diagram of the comparison circuit illustrated in FIG. 5.

Referring to FIG. 6, the comparison circuit 40 may include a comparator module 42, a latch module 44, and a buffer module 46.

The comparator module 42 may include (M−1) rail-to-rail comparators 421 configured to compare the differential input signals INP and INN to (M−1) differential reference voltages REF1_1 to REF1_(M−1) and REF2_1 to REF2_(M−1).

Each of the rail-to-rail comparators 421 may include the comparator 10 or 20 illustrated in FIG. 3 or 4, respectively. Therefore, even when the potential of the input signals INP and INN is lower than the threshold voltage of the amplifiers, the amplifiers are not turned off while performing the comparison and amplification to operation.

The output signals of the comparators 421 forming the comparator module 42 may be inputted to latches of the latch module 44, respectively, and then stabilized, and may output signals of the latch module 44 which are provided to buffers of the buffer module 46, respectively, and then may be outputted as digital codes, for example, thermometer codes OUT1 to OUT(M−1).

Figure 7:
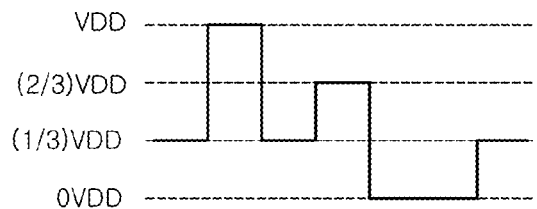
FIG. 7 is a diagram illustrating the voltage ranges of input signals in a 4-PAM receiver.

FIG. 7 is a diagram illustrating the voltage ranges of input signals in a 4-PAM receiver.

When a 4-PAM system is used, input signals may have four voltage levels in the range of 0 to VDD. FIG. 7 illustrates a case in which signals inputted to the 4-PAM receiver have voltage levels of 0, (1/3)VDD, (2/3)VDD, and VDD. In this case, (M−1) differential reference voltages, i.e., three differential reference voltages may be set to a value between 0 and (1/3)VDD, a value between (1/3)VDD and (2/3)VDD, and a value between (2/3)VDD and VDD, respectively.

Figure 1:
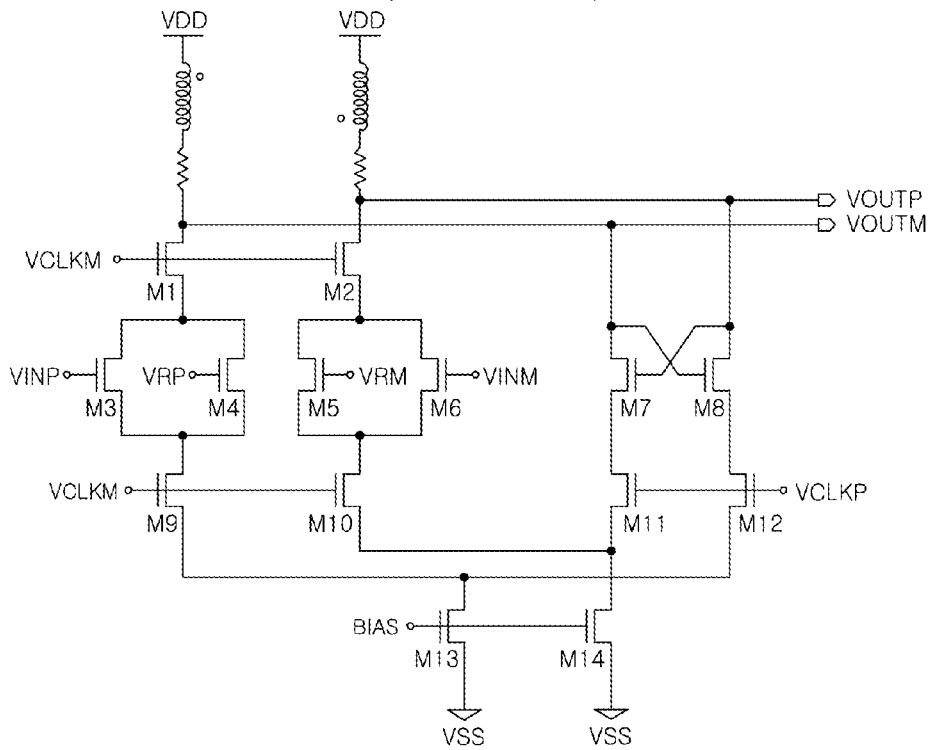
FIG. 1 illustrates an example of a conventional CML comparator.
Figure 2:
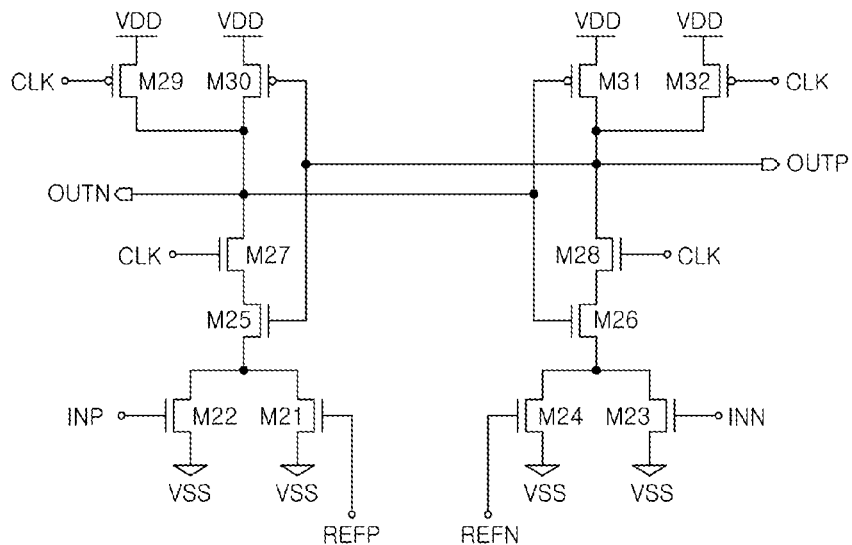
FIG. 2 illustrates an example of a CMOS dynamic comparator.

When the level of an input signal corresponds to (1/3)VDD lower than (1/2)VDD, the CMOS dynamic comparator illustrated in FIG. 2 may not operate because the amplifiers are not turned on. However, since the rail-to-rail comparator according to an embodiment includes the PMOS comparator, a low-level input signal may be sufficiently detected.

Figure 8:
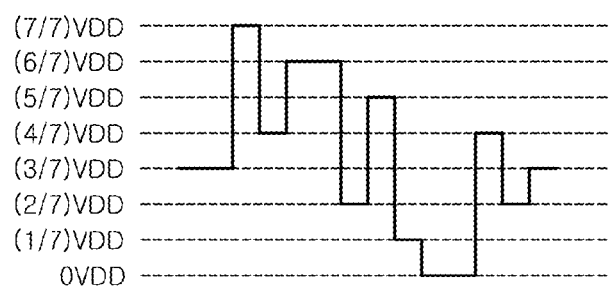
FIG. 8 is a diagram illustrating the voltage ranges of input is signals in an 8-PAM receiver.

FIG. 8 is a diagram illustrating the voltage ranges of input signals in an 8-PAM receiver.

The 8-PAM receiver may receive input signals at any one voltage level of 0, (1/7)VDD, (2/7)VDD, (3/7)VDD, (4/7)VDD, (5/7)VDD, (6/7)VDD, and (7/7)VDD or VDD. In this case, differential reference voltages may be decided as values between the respective input signal levels, and compared to the input signals.

Even in this case, the input signals having voltage levels of (1/7)VDD, (2/7)VDD, and (3/7)VDD less than (1/2)VDD may be detected by the PMOS comparator.

Figure 9:
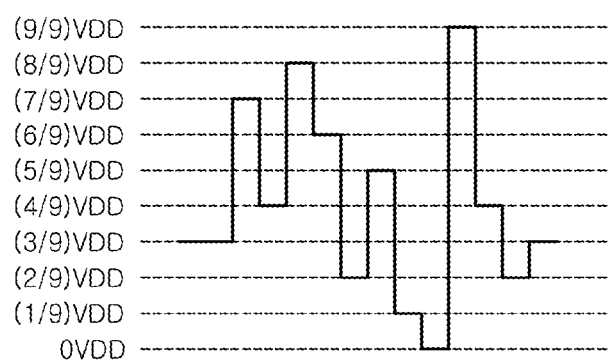
FIG. 9 is a diagram illustrating the voltage ranges of an input signals in a 10-PAM receiver.

FIG. 9 is a diagram illustrating the voltage ranges of an input signals in a 10-PAM receiver.

The 10-PAM receiver may receive input signals at any one voltage level of 0, (1/9)VDD, (2/9)VDD, (3/9)VDD, (4/9)VDD, (5/9)VDD, (6/9)VDD, (7/9)VDD, (8/9)VDD, and (9/9)VDD or VDD. Furthermore, a comparison circuit forming the 10-PAM receiver may determine the levels of the input signals using differential reference voltages decided as values between the respective input signal levels.

Referring to FIGS. 7 to 9, it can be seen that, as M increases, the margin between the input signal levels decreases, and an input signal having a low voltage level close to 0V may be received.

Even in this case, since the PAM receiver according to an embodiment may use the rail-to-rail comparators based on CMOS logic, the PAM receiver may detect input signals in all voltage ranges, and may guarantee system performance and reliability because it has a small power consumption.

Figures 10, 11:
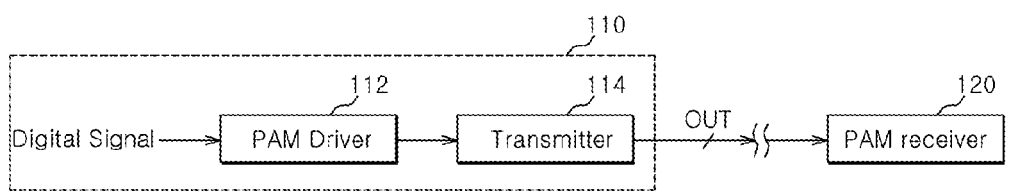
FIG. 10 is a table illustrating the output operation of the comparison circuit based on differential input signals and differential reference voltages in the 4-PAM receiver.
FIG. 11 is a configuration diagram of an example of a PAM communication system according to another embodiment.

FIG. 10 is a table illustrating the output operation of the comparison circuit based on differential input signals and differential reference voltages in the 4-PAM receiver.

In FIG. 10, suppose for example that reference voltages REF1_1 to REF1_3 for detecting the levels of the differential input signals IPN and INN are set to (1/6)VDD, (1/2)VDD, and (5/6)VDD, respectively. In this case, differential reference voltages REF2_1 to REF2_3 are set to (5/6)VDD, (1/2)VDD, and (1/6)VDD, respectively.

When the differential input signals INP and INN are inputted as (VDD, GND), ((2/3)VDD, (1/3)VDD), ((1/3)VDD, (2/3)VDD), and (GND, VDD), respectively, the differential output signals OUTP and OUTN of the rail-to-rail comparator 20 illustrated in FIG. 4 may be indicated as shown in FIG. 10.

The differential output signals OUTP and OUTN indicated in FIG. 10 are equal to values calculated from Equation 1 below. Equation 1 may be modeled from the rail-to-rail comparator 20 illustrated in FIG. 4.

$$K_n = \mu_n C_{ox} \frac{W}{L},$$ [Equation 1]

$$K_p = \mu_p C_{ox} \frac{W}{L}$$

$$R_{on\_nmos} = \frac{1}{K_n(V_{IN} - V_{th})},$$

$$R_{on\_pmos} = \frac{1}{K_p(|V_{IN} - V_{th}|)}$$

$$\text{out} = K_n[(V_{INP} - V_{TH,NMOS} + V_{REFP} - V_{TH,NMOS}) - (V_{INN} - V_{TH,NMOS} + V_{REFN} - V_{TH,NMOS})] +$$

$$K_p[(|V_{INP} - V_{TH,PMOS}| + |V_{REFP} - V_{TH,PMOS}|) - (|V_{INN} - V_{TH,PMOS}| + |V_{REFN} - V_{TH,PMOS}|)]$$

Here, $\mu_n$ represents an electron mobility of an NMOS transistor, $\mu_p$ represents a hole mobility of a PMOS transistor, $C_{ox}$ represents gate oxide capacitance, W represents a transistor width, L represents a transistor length, $K_n$ represents a transconductance parameter [μA/V*V] of the NMOS transistor, $K_p$ represents a transconductance parameter [μA/V*V] of the PMOS transistor, $R_{on\_nmos}$ represents a resistance when the NMOS transistor is turned on to operate in a triode region, $R_{on\_pmos}$ represents resistance when the PMOS transistor is turned on to operate in a triode region, $V_{th}$ represents a threshold voltage ($V_{TH,NMOS}$ in the case of the NMOS transistor, and $V_{TH,PMOS}$ in the case of the PMOS transistor), $V_{INP}$ represents a voltage of the input signal INP, $V_{INN}$ represents a voltage of the input signal INN, $V_{REFP}$ represents a voltage of the reference is signal REFP (=REF1), and $V_{REFN}$ represents a voltage of the reference signal REFN (=REF2).

Referring to Equation 1 and FIG. 4, the output operation of the comparison circuit will be generally described in more detail as follows.

The amount of current flowing from the first comparator 221 to the first latch 261 corresponds to the sum of amounts of currents flowing through transistors T5 and T6, and may be expressed as $|V_{INP} - V_{TH,PMOS}| + |V_{REF1} - V_{TH,PMOS}|$. Furthermore, the amount of current flowing from the second comparator 223 to the second latch 263 corresponds to the sum of amounts of currents flowing through transistors T7 and T8, and may be expressed as $|V_{INN} - V_{TH,PMOS}| + |V_{REF2} - V_{TH,PMOS}|$. As a result, the first output signal OUTP becomes $K_p[(|V_{INP} - V_{TH,PMOS}| + |V_{REF1} - V_{TH,PMOS}|) - (|V_{INN} - V_{TH,PMOS}| + |V_{REF2} - V_{TH,PMOS}|)] = A$.

Furthermore, the amount of current flowing from the first latch 261 to the third comparator 241 corresponds to the sum of amounts of currents flowing through transistors T1 and T2, may be expressed as $V_{INP} - V_{TH,NMOS} + V_{REF1} - V_{TH,NMOS}$. Furthermore, the amount of current flowing from the second latch 263 to the fourth comparator 243 corresponds to the sum of amounts of currents flowing through is transistors T3 and T4, and may be expressed as $V_{INN} - V_{TH,NMOS} + V_{REF2} - V_{TH,NMOS}$. Therefore, the second output signal OUTN becomes $K_n[(V_{INP} - V_{TH,NMOS} + V_{REF1} - V_{TH,NMOS}) - (V_{INN} - V_{TH,NMOS} + V_{REF2} - V_{TH,NMOS})] = B$.

As described with reference to Equation 1, the final output signal OUT of the rail-to-rail comparator according to an embodiment may be decided by the sum of A and B. When the differential input signals INP and INN are compared to the differential reference signals REF1 and REF2, the output signal OUTN may be outputted at a high voltage logic level in case where the sum of current amounts based on the input signal INN and the reference voltage REF2 is greater than the sum of current amounts based on the input signal INP and the reference voltage REF1.

Referring to Equation 1, when the final output signal OUT is less than 0, the output signal OUTN may be decided as a high voltage logic level, and the output signal OUTP may be decided as a low voltage logic level. Furthermore, when the final output signal OUT is greater than 0, the output signal OUTN may be decided as a low voltage logic level, and the output signal OUTP may be decided as a high voltage logic level.

As such, the rail-to-rail comparator according to an embodiment may compare input signals in all voltage ranges to the reference signals to decide an output voltage level, and may be usefully applied to a low power system, because it has a small power consumption.

FIG. 11 is a configuration diagram of an example of a PAM is communication system according to another embodiment.

Referring to FIG. 11, the PAM communication system 100 may include a PAM transmitter 110 and a PAM receiver 120.

The PAM transmitter 110 may include a PAM driver 112 and a transmitter 114. The PAM driver 112 may be configured to convert an inputted digital signal into a multi-level analog signal, and the transmitter 114 may be configured to transmit the analog signal outputted from the PAM driver 112 through a channel.

The PAM receiver 120 may include the PAM receiver illustrated in FIGS. 5 and 6.

The PAM communication system 100 may be configured as an M-PAM communication system. Furthermore, the PAM transmitter 110 may generate and output signals having any one level of first to M-th levels as a differential signal pair, and the PAM receiver 120 may receive the differential signal pair from the transmitter 110, compare the received differential signal pair to differential reference voltages, and may generate an output signal. At this time, the differential signal pair and the differential reference voltages may be compared by a comparison circuit which may include a first comparison unit configured to compare the differential signal pair to the differential reference voltages, a second comparison unit configured to compare the differential signal pair to the differential reference voltages, and an output unit driven in response to a clock signal and configured to generate complementary output signals according to the comparison results of the first and second is comparison units.

The output signal of the output circuit may include a thermometer code.

Furthermore, the signal outputted from the comparison circuit may be restored into a data signal by a decoder, and then amplified and outputted by an output circuit. Furthermore, the decoder may include thermometer-to-binary logic to convert the thermometer code of the output circuit into binary data.

The communication system including the PAM receiver according to an embodiment may restore input signals transmitted from the transmitter using the first and second comparison units having a complementary relationship. Therefore, the communication system may restore input signals in all voltage ranges into original signals.

While certain embodiments have been described above, it will be understood to those skilled in the art that the embodiments described are by way of example only. Accordingly, the apparatus described herein should not be limited based on the described embodiments. Rather, the apparatus described herein should only be limited in light of the claims that follow when taken in conjunction with the above description and accompanying drawings.

What is claimed is:

1. A rail-to-rail comparator comprising:
   a first comparison unit connected between a first terminal and a first output terminal, and configured to compare differential input signals to differential reference voltages and to generate a first comparison result through the first output terminal;
   a second comparison unit connected between a second terminal and a second output terminal, and configured to compare the differential input signals to the differential reference voltages and to generate a second comparison result through the second output terminal; and
   an output unit connected between the first output terminal and the second output terminal, and configured to be driven in response to a clock signal and to generate a complementary output signal according to the first comparison result and the second comparison result.

2. The rail-to-rail comparator according to claim 1, wherein the first and second comparison units have a complementary relationship.

3. The rail-to-rail comparator according to claim 1, wherein the output unit outputs the complementary output signal as a digital code.

4. The rail-to-rail comparator according to claim 1, wherein the first terminal comprises a power supply voltage terminal, and the second terminal comprises a ground terminal.

5. The rail-to-rail comparator according to claim 1, wherein the first comparison unit comprises a PMOS amplifier.

6. The rail-to-rail comparator according to claim 5, wherein the second comparison unit comprises an NMOS amplifier.

7. A rail-to-rail comparator comprising:
   a first comparison unit configured to compare first and second input signals having a differential relationship to first and second reference voltages having a differential relationship, respectively;
   a second comparison unit configured to compare the first and second input signals to the first and second reference voltages, respectively; and
   an output unit configured to be connected logically between the first and second comparison units, and configured to generate an output signal according to an amount of current flowing through the first and second comparison units, in response to a clock signal,
   wherein the first comparison unit is configured to be connected between a first terminal and a first output terminal, and generate a first comparison result through the first output terminal;
   the second comparison unit is configured to be connected between a second terminal and a second output terminal, and generate a second comparison result through the second output terminal; and
   the output unit is configured to be connected between the first output terminal and the second output terminal.

8. The rail-to-rail comparator according to claim 7, wherein the first comparison unit comprises:
   a first comparator configured to compare the first input signal to the first reference voltage; and
   a second comparator configured to compare the second input signal to the second reference voltage,
   the second comparison unit comprises:
   a third comparator configured to compare the first input signal to the first reference voltage; and
   a fourth comparator configured to compare the second input signal to the second reference voltage, and the output unit configured to output the output signal as a first output signal and a second output signal in a differential relationship with the first output signal, according to an amount of current flowing through the first, second, third, and fourth comparators.

9. The rail-to-rail comparator according to claim 7, further comprising a precharge unit connected to the output unit and configured to precharge the output signal in response to the clock signal.

10. The rail-to-rail comparator according to claim 7, wherein the first and second comparison units have a complementary relationship.

11. A pulse amplitude modulation (PAM) receiver comprising:
a comparison circuit configured to generate and compare differential input signals to differential reference voltages and generate an output signal;
a decoder configured to restore a signal outputted from the comparison circuit into a data signal; and
an output circuit configured to amplify and output the data signal outputted from the decoder,
wherein the comparison circuit comprises:
a first comparison unit connected between a first terminal and a first output terminal, and configured to compare the differential input signals to the differential reference voltages and to generate a first comparison result through the first output terminal;
a second comparison unit connected between a second terminal and a second output terminal, and configured to compare the differential input signals to the differential reference voltages and to generate a second comparison result through the second output terminal; and
an output unit connected between the first output terminal and the second output terminal, and configured to be driven in response to a clock signal, to generate a complementary output signal according to the first comparison result and the second comparison result.

12. The PAM receiver according to claim 11, wherein the first and second comparison units have a complementary relationship.

13. The PAM receiver according to claim 11, wherein the output unit outputs the complementary output signal as a thermometer code.

14. The PAM receiver according to claim 13, wherein the decoder comprises thermometer-to-binary logic to convert the thermometer code into binary data.

15. The PAM receiver according to claim 11, wherein the first terminal is a power supply voltage terminal, and the second terminal is a ground terminal.

16. The PAM receiver according to claim 11, wherein the PAM receiver comprises an M-PAM receiver, and the comparison circuit comprises comparison circuits to compare the differential input signals to differential reference voltages.

17. A PAM communication system comprising:
a transmitter configured to generate and output signals having any one level of a level to multiple levels, as a differential signal pair; and
a receiver comprising a comparison circuit configured to receive the differential signal pair, compare the received differential signal pair to differential reference voltages, and generate an output signal,
wherein the comparison circuit comprises:
a first comparison unit connected between a first terminal and a first output terminal, and configured to compare the differential signal pair to the differential reference voltages and to generate a first comparison result through the first output terminal;
a second comparison unit connected between a second terminal and a second output terminal, and configured to compare the differential signal pair to the differential reference voltages and to generate a second comparison result through the second output terminal; and
an output unit connected between the first output terminal and the second output terminal, and configured to be driven in response to a clock signal, and to generate a complementary output signal according to the first comparison result and the second comparison result.

18. The PAM communication system according to claim 17, wherein the first and second comparison units have a complementary relationship.

19. The PAM communication system according to claim 17, wherein the receiver comprises:
a decoder configured to restore the signal outputted from the comparison circuit into a data signal; and
an output circuit configured to amplify and output the data signal outputted from the decoder.

20. The PAM communication system according to claim 19, wherein the output unit outputs the complementary output signal as a thermometer code.

21. The PAM communication system according to claim 20, wherein the decoder comprises thermometer-to-binary logic to convert the thermometer code into binary data.

22. The PAM communication system according to claim 17, wherein the first terminal is a power supply voltage, and the second terminal is a ground terminal.

23. The PAM communication system according to claim 17, wherein the PAM communication system is configured as an M-PAM communication system, and the comparison circuit comprises comparison circuits configured to compare the differential input signals to differential reference voltages.

* * * * *